US010803927B2

(12) United States Patent
Noel et al.

(10) Patent No.: US 10,803,927 B2
(45) Date of Patent: Oct. 13, 2020

(54) PARTITIONED MEMORY CIRCUIT CAPABLE OF IMPLEMENTING CALCULATION OPERATIONS

(71) Applicant: Commissariat à l'Énergie Atomique et aux Énergies Alternatives, Paris (FR)

(72) Inventors: Jean-Philippe Noel, Eybens (FR); Avishek Biswas, Grenoble (FR); Bastien Giraud, Voreppe (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 121 days.

(21) Appl. No.: 16/224,723

(22) Filed: Dec. 18, 2018

(65) Prior Publication Data

US 2019/0189198 A1    Jun. 20, 2019

(30) Foreign Application Priority Data

Dec. 19, 2017    (FR) ...................................... 17 62470

(51) Int. Cl.
| | | |
|---|---|---|
| *G11C 11/419* | (2006.01) | |
| *G11C 7/18* | (2006.01) | |
| *G11C 11/412* | (2006.01) | |
| *G11C 7/10* | (2006.01) | |
| *G11C 15/04* | (2006.01) | |

(52) U.S. Cl.
CPC .......... *G11C 11/419* (2013.01); *G11C 7/1006* (2013.01); *G11C 7/18* (2013.01); *G11C 11/412* (2013.01); *G11C 15/04* (2013.01); *G11C 2207/005* (2013.01)

(58) Field of Classification Search
CPC combination set(s) only.
See application file for complete search history.

(56) References Cited

U.S. PATENT DOCUMENTS 6,661,731 B2 * 12/2003 Fujimoto ................. G11C 7/18
                                                        365/230.03
8,982,645 B2 *  3/2015 Kajigaya ................ G11C 5/025
                                                        365/189.02

(Continued)

FOREIGN PATENT DOCUMENTS

| JP | 2008-198243 A | 8/2008 |
|---|---|---|
| WO | WO 2016/144726 A1 | 9/2016 |

OTHER PUBLICATIONS

Preliminary Search Report for French Application No. 1762470, dated Sep. 24, 2018.

*Primary Examiner* — Harry W Byrne
*Assistant Examiner* — R Lance Reidlinger
(74) *Attorney, Agent, or Firm* — Wolf, Greenfield & Sacks, P.C.

(57) ABSTRACT

A memory circuit including a plurality of elementary cells distributed in a plurality of arrays, each including N columns, N being an integer greater than or equal to 2, wherein: each column of each array includes a first local bit line directly connected to each of the cells in the column; each column of each array includes a first general bit line coupled to the first local bit line of the column by a first coupling circuit; and the first general bit lines of the columns of same rank j of the different arrays, j being an integer in the range from 0 to M−1, are coupled together.

14 Claims, 8 Drawing Sheets

(56) References Cited

U.S. PATENT DOCUMENTS

2002/0036944 A1    3/2002   Fujimoto
2012/0314468 A1   12/2012   Siau et al.
2013/0051170 A1    2/2013   Kuroda

* cited by examiner

PARTITIONED MEMORY CIRCUIT CAPABLE OF IMPLEMENTING CALCULATION OPERATIONS

CROSS-REFERENCE TO RELATED APPLICATIONS

This application claims priority to French patent application number 17/62470, filed on Dec. 19, 2017, which is incorporated herein by reference in its entirety.

BACKGROUND

The present application concerns the field of memory circuits. It more particularly aims at a memory circuit capable of implementing calculation operations.

DISCUSSION OF THE RELATED ART

A memory circuit capable not only of storing data, but also of executing, in situ, during accesses to the memory content, a number of logic and/or arithmetic operations having as operands data stored in the circuit, has already been provided in French patent application No. 16/54623 (DD16812/B14843) filed by the applicant on May 24, 2016. This circuit comprises, as in a conventional memory circuit, a plurality of elementary cells arranged in rows and columns, and a control circuit capable of implementing data read or write operations in rows or portions of rows of the array. Unlike a conventional memory circuit where only one row of the array can be selected at a time during a read operation, the control circuit is capable of simultaneously selecting in read mode a plurality of rows of the array to perform a logic operation having as operands the data contained in the selected rows.

It would be desirable to at least partly improve certain aspects of such a memory circuit.

SUMMARY

Thus, an embodiment provides a memory circuit comprising a plurality of elementary cells distributed in a plurality of arrays, each comprising M columns, M being an integer greater than or equal to 2, wherein:

each column of each array comprises a first local bit line directly connected to each of the cells in the column;

each column of each array comprises a first general bit line coupled to the first local bit line of the column by a first coupling circuit, the first coupling circuit being controllable to:
- isolate the first local bit line of the column from its first general bit line,
- transmit over the first general bit line of the column a binary signal present on its first local bit line, or
- transmit over the first local bit line of the column a binary signal present on its first general bit line; and the first general bit lines of the columns of same rank j of the different arrays, j being an integer in the range from 0 to M−1, are coupled together.

According to an embodiment, each first coupling circuit comprises:

first and second transistors series-connected between a node of application of a power supply voltage of the circuit and the first general bit line of the column; and third and fourth transistors series-connected between the first local bit line of the column and a node of application of a reference potential of the circuit, the gate of the second transistor being connected to the first local bit line of the column, and the gate of the third transistor being connected to the first general bit lines of the column.

According to an embodiment, the arrays belong to a same memory module, the first general bit lines of the columns of same rank j of the different arrays being directly interconnected.

According to an embodiment, the arrays belong to different memory modules, the first general bit lines of the columns of same rank j of the different arrays being series-coupled via additional coupling circuits.

According to an embodiment, each additional coupling circuit coupling in series a first general bit line of a first column of rank j of a memory module to a first general bit line of a second column of same rank j of a neighboring memory module, is controllable to:
isolate said first general bit lines from each other,
copy onto the first general bit line of the second column a binary signal present on the first general bit line of the first column, or
copy onto the first general bit line of the first column a binary signal present on the first general bit line of the second column.

According to an embodiment, each additional coupling circuit comprises:

an amplifier having an input coupled to the first general bit line of the first column by a fifth transistor and an output coupled to the first general bit line of the second column by a sixth transistor;

a seventh transistor coupling the first general bit line of the first column to the output of the amplifier; and an eighth transistor coupling the first general bit line of the second column to the input of the amplifier.

According to an embodiment, in each additional coupling circuit, the gates of the fifth and sixth transistors are connected to a same first conductive track controlling the coupling circuit, and the gates of the seventh and eighth transistors are connected to a same second conductive track controlling the coupling circuit.

According to an embodiment, in each column of each array, the first local bit line and the first general bit line of the column extend along the column direction and, for each column of each array, the memory circuit further comprises a first additional general bit line connected to the first general bit line of the column, the first additional general bit line extending orthogonally to the column direction.

According to an embodiment, the arrays are arranged in an array of rows and columns, the arrays of a same column being coupled to one another by their first general bit lines and the arrays of a same row being coupled to one another by their first additional general bit lines.

According to an embodiment, the memory circuit comprises a control circuit capable of simultaneously activating in read mode a first cell of a column of rank j of a first array of the memory circuit, and a second cell of a second column of same rank j of a second array of the memory circuit, and of controlling the coupling circuit(s) coupling the first local bit line of the first column to the first local bit line of the second column to transmit over the first local bit line of the second column a binary signal present on the first local bit line of the first column, to perform a logic operation having as operands the data stored in the first and second cells.

According to an embodiment:
each column of each array comprises a second local bit line directly connected to each of the cells in the column; and each column of each array comprises a second general bit line coupled to the second local bit line of the column by a second coupling circuit, the second coupling circuit being controllable to:

isolate the first local bit line of the column from its second general bit line, transmit over the second general bit line of the column a binary signal present on its second local bit line, or transmit over the second local bit line of the column a binary signal present on its second general bit line; and the second general bit lines of the columns of same rank j of the different arrays are interconnected.

According to an embodiment, the memory circuit further comprises, for each column of each array, an additional circuit connected to the first and second local bit lines and to the first and second general bit lines of the column, the additional circuit being capable of implementing logic calculation operations having as operands binary data applied to the first and second local bit lines of the column and of supplying the results of these operations on the first and second general bit lines of the column.

According to an embodiment, the additional circuit comprises:

a first transistor coupling the first general bit line to a first intermediate node;

a second transistor coupling a second intermediate node to a node of application of a low power supply potential of the memory circuit;

a third transistor coupling the second general bit line to a third intermediate node;

a fourth transistor coupling a fourth intermediate node to the node of application of the low power supply potential of the memory circuit;

a first switch coupling the first intermediate node to the second intermediate node;

a second switch coupling the third intermediate node to the fourth intermediate node;

a third switch coupling the second intermediate node to the third intermediate node; and a fourth switch coupling the first intermediate node to the fourth intermediate node.

According to an embodiment:

the gate of the third transistor of the additional circuit is coupled to the first local bit line of the column;

the gate of the second transistor of the additional circuit is coupled to the second local bit line of the column;

the gate of the first transistor of the additional circuit is coupled to a node supplying a binary signal complementary to the binary signal carried by the first local read bit line of the column; and the gate of the fourth transistor is coupled to a node supplying a binary signal complementary to the binary signal carried by the second local read bit line of the column.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
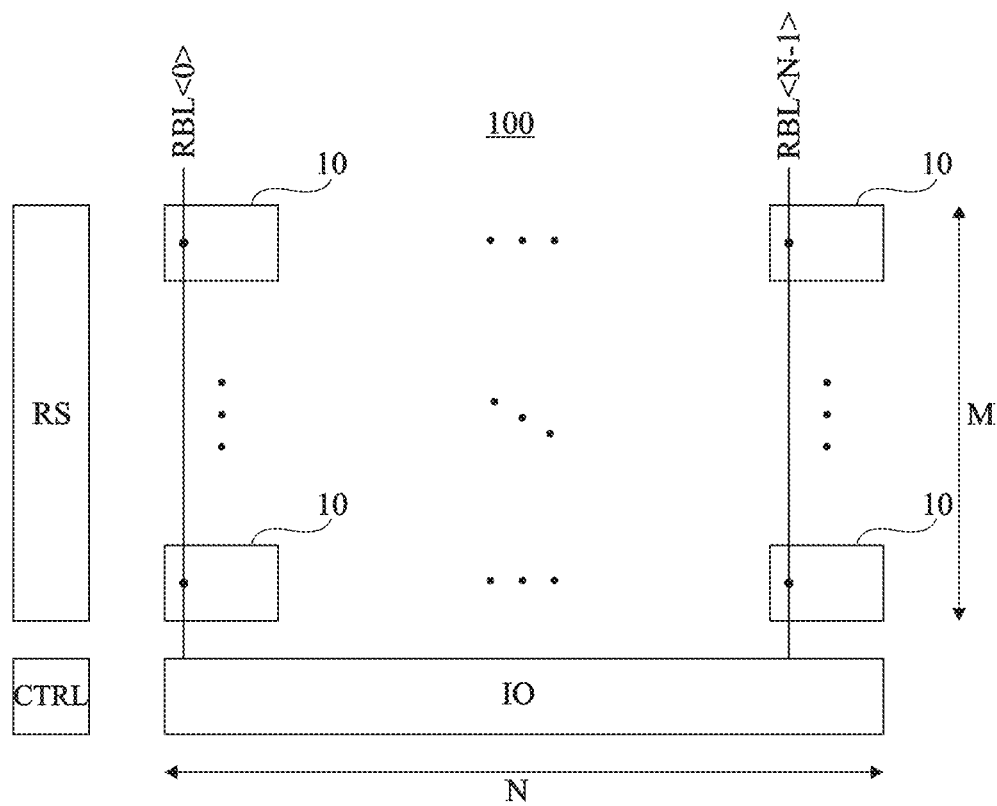
FIG. 1 schematically shows an example of a memory module.

The same elements have been designated with the same reference numerals in the different drawings. For clarity, only those steps and elements which are useful to the understanding of the described embodiments have been shown and are detailed. In the following description, references to high- and low-level signals should be interpreted relatively, as corresponding to two different states of the binary signals processed by the described circuits. As an example, the high-level signals correspond to potentials in the order of a high power supply potential VDD of the described circuits (for example, equal to VDD to within 0.5 V), and the low-level signals correspond to potentials in the order of a low power supply potential GND of the described circuits (for example, equal to GND to within 0.5 V).

FIG. 1 schematically shows an example of a memory module 100. In practice, a memory circuit of an electronic device may comprise one or a plurality of memory modules, for example, identical. In the case of a memory circuit with a plurality of modules, the different modules may be integrated on a same semiconductor chip, or on different chips.

Memory module 100 of FIG. 1 comprises a plurality of elementary cells 10 arranged in an array of rows having a first direction (horizontal in the orientation of FIG. 1) and of columns having a second direction (vertical in the orientation of FIG. 1). In the example of FIG. 1, the array comprises M rows and N columns, where M and N are integers greater than or equal to 2.

Each elementary cell 10 is capable of storing a data bit. The elementary cells 10 of a same column of the array are connected to a same output conductive track or read bit line RBL of the module, it being understood that the elementary cells 10 of different columns are connected to different read bit lines RBL. In other words, for each column of rank j of the array, where j is an integer in the range from 0 to N−1, the module comprises a read bit lines RBL<j> specific to the column, interconnecting the column cells. Read bit lines RBL<j> extend in the column direction of the array, that is, vertically in the orientation of FIG. 1. Read bit lines RBL<j> are connected to a same input/output circuit IO of the module, for example, arranged at an end of the columns of the array.

Module 100 further comprises a row selection circuit RS, for example, arranged at an end of the rows of the array.

Module 100 further comprises a control circuit CTRL capable of receiving instructions originating from a device external to the module, and of accordingly controlling the elementary cells 10 of the module via row selection circuit RS and/or via input/output circuit IO of the module.

In this example, the memory module is capable not only of storing data, but also of executing, in situ, during accesses to the memory content, a number of logic and/or arithmetic operations having as operands data stored in the module. The results of the calculations may be transmitted to circuits external to the module, and/or be rewritten into the module without transiting through circuits external to the module, and particularly over a data bus external to the module.

Figure 2:
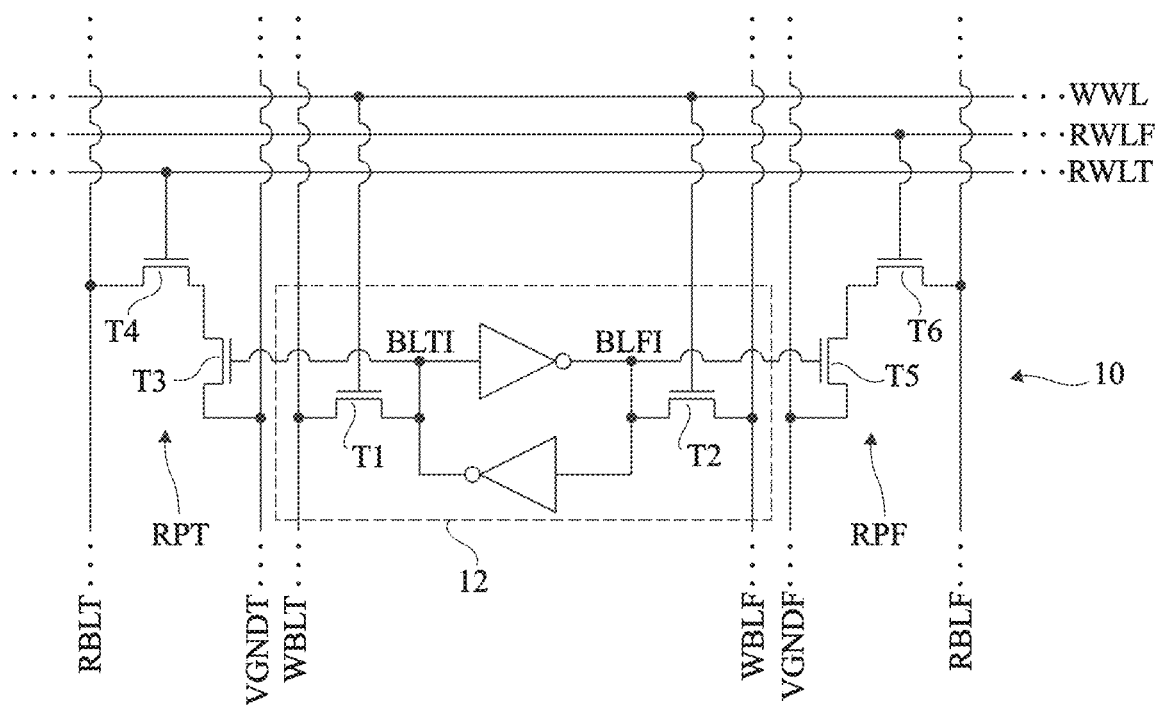
FIG. 2 is a more detailed electric diagram of an example of an elementary cell of a memory module.

FIG. 2 is a detailed electric diagram of an example of an elementary cell 10 of a memory module of the type described in relation with FIG. 1.

Elementary cell 10 of FIG. 2 is a cell comprising ten transistors. It comprises a SRAM storage cell 12 comprising six transistors, and two read ports RPT and RPF comprising two transistors each. Storage cell 12 comprises two inverters (two transistors each) assembled in antiparallel between a first data bit storage node BLTI and a second node BLFI for storing a data bit complementary to the bit stored on node BLTI. Storage cell 12 further comprises a first access transistor T1 connecting, by its conduction nodes, node BLTI to a conductive track WBLT called write bit line, and a second access transistor T2 connecting, by its conduction nodes, node BLFI to a conductive track WBLF called complementary write bit line. The gates of transistors T1 and T2 are connected to a same conductive write control track WWL. Read port RPT comprises two transistors T3 and T4 series-assembled via their conduction nodes between a conductive track VGNDT of application of a reference potential and a conductive output track RBLT called read bit line. Transistor T3 is located on the side of track VGNDT and has its gate connected to node BLTI, and transistor T4 is located on the side of track RBLT and has its gate connected to a conductive read control track RWLT. Read port RPF comprises two transistors T5 and T6 series-assembled via their conduction nodes between a conductive track VGNDF of application of a reference potential and a conductive output track RBLF called complementary read bit line. Transistor T5 is located on the side of track VGNDF and has its gate connected to node BLFI, and transistor T6 is located on the side of track RBLF and has its gate connected to a conductive read control track RWLF. In this example, transistors T1, T2, T3, T4, T5, T6 are N-channel MOS transistors.

In a memory module of the type described in relation with FIG. 1, the elementary cells of a same row of the module are interconnected via their conductive tracks WWL, respectively RWLF, respectively RWLT, and the elementary cells of a same column of the module are interconnected via their conductive tracks RBLT, respectively VGNDT, respectively WBLT, respectively WBLF, respectively VGNDF, respectively RBLF. In other words, the cells of a same row share a same conductive track WWL, a same conductive track RWLF, and a same conductive track RWLT, and the cells of a same column share a same conductive track RBLT, a same conductive track VGNDT, a same conductive track WBLT, a same conductive track WBLF, a same conductive track VGNDF, and a same conductive track RBLF. The cells of different rows have different conductive tracks WWL, respectively RWLF, respectively RWLT, and the cells of different columns have different conductive tracks RBLT, respectively VGNDT, respectively WBLT, respectively WBLF, respectively VGNDF, respectively RBLF. As an example, conductive tracks WWL, RWLF, and RWLT are connected to the row selection circuit RS of the module, and conductive tracks RBLT, VGNDT, WBLT, WBLF, VGNDF, and RBLF are connected to the input/output circuit IO of the module.

As an example, read bit line RBLT of cell 10 of FIG. 2 corresponds to a read bit line RBL of the module of FIG. 1. For simplification, in the drawings of the memory module of the present application (FIGS. 1, 3, 5, and 8), a single read bit line has been show per elementary cell of the module. In practice, the described embodiments may be implemented either in memory circuits formed of elementary cells with a single read bit line, for example, cells of the type described in relation with FIG. 2, but which would not comprise transistors T5 and T6 and conductive tracks VGNDF, RBLF, and RWLF, or in memory circuits formed of elementary cells comprising two complementary read bit lines, for example, of the type described in relation with FIG. 2, provided to make adaptations which are within the abilities of those skilled in the art.

To read from an elementary cell 10 of the type described in relation with FIG. 2 via its read port RPT, the read bit line RBLT of the cell is first precharged to a high level, for example, to power supply voltage VDD of the module. Conductive track VGNDT is maintained at a low level, for example, at low potential GND used as a reference for power supply voltage VDD of the module. Transistor T4 of the cell is then turned on by application of a high-level signal to conductive track RWLT of the cell. After the activation of transistor T4, conductive track RBLT discharges if the potential of node BLTI is at a high level (transistor T3 on) and remains substantially at its precharge level if potential BLTI is at a low level (transistor T3 off). The reading of the potential of track RBLT via the input/output circuit IO of the module enables to determine the value of the data bit stored in the elementary cell. The cell may further be read from substantially in the same way via its read port RPF.

To implement calculation operations, in a memory module formed of elementary cells 10 of the type described in relation with FIG. 2, control circuit CTLR of the memory module is capable of simultaneously activating in read mode (via row selection circuit RS) two, or a number greater than two, of elementary cells of a same column of the module, via the access ports RPT and/or via the access ports RPF of these cells.

As an illustration, it is considered that two elementary cells 10 of a same column are simultaneously activated in read mode via their ports RPT and RPF. To achieve this, after having precharged to a high level the read bit lines RBLT and RBLF of the column and set to a low level the reference conductive tracks VGNDT and VGNDF of the column, the selection transistors T4 and T6 of the two selected cells are simultaneously turned on, via the control conductive tracks RWLT and RWLF of the corresponding rows. The binary values stored on nodes BLTI of the two considered cells are respectively designated with A and B. Complementary binary values $\overline{A}$ and $\overline{B}$ are then stored on the respective nodes BLFI of the two cells. The conductive output track RBLT of the column remains at its high precharge level only if the two values A and B are at a low level. Thus, the level read from output track RBLT of the column at the end of the read operation corresponds to result $\overline{A+B}$, of a logic NOR calculation operation between the two selected memory cells. Further, the conductive output track RBLF of the column remains at its high precharge level only if the two values A and B are at a high level. Thus, the level read from output track RBLF of the column at the end of the read operation corresponds to result A·B of a logic AND calculation operation between the two selected memory cells.

By simultaneously activating in read mode a number greater than two of cells of a same column, the above-mentioned calculation operations may be implemented with a number of operands greater than 2. Further, by simultaneously activating in read mode a plurality of columns of the module, the calculation operations may be implemented on words comprising a plurality of bits.

Thus, such a memory module enables to directly implement basic calculation operations in the memory, without requiring having the data transit through an arithmetic and logic module external to the circuit.

To enable to rewrite the result of a calculation operation without having the calculated data transit through circuits external to the memory module, and particularly over a data bus external to the module, the input/output circuit IO of the memory module may comprise an internal redirection circuit (not detailed) enabling to couple the read bit line(s) of each column of the module to a data input node of the column and/or of another column of the array, for example, to the conductive track WBLT and/or to the conductive track WBLF of the column or of another column of the array in an architecture of the type described in relation with FIG. 2.

In a memory module of the type described in relation with FIGS. 1 and 2, a problem which is posed is that when number M of rows of the array is significant, the times of access to the data stored in the module may be relatively long. To limit such access times, it may be provided to partition the module into a plurality of arrays of m rows and N columns, where m is an integer smaller than M, for example, a sub-multiple of M, each array of m*N cells being associated with its own input/output circuit while the read bit lines of the different arrays of the module are not interconnected.

However, a disadvantage then is that, due to the lack of electric connection between the read bit lines of the different arrays of the module, it is only possible to perform calculation operations between data contained in a same array of the module.

Figure 3:
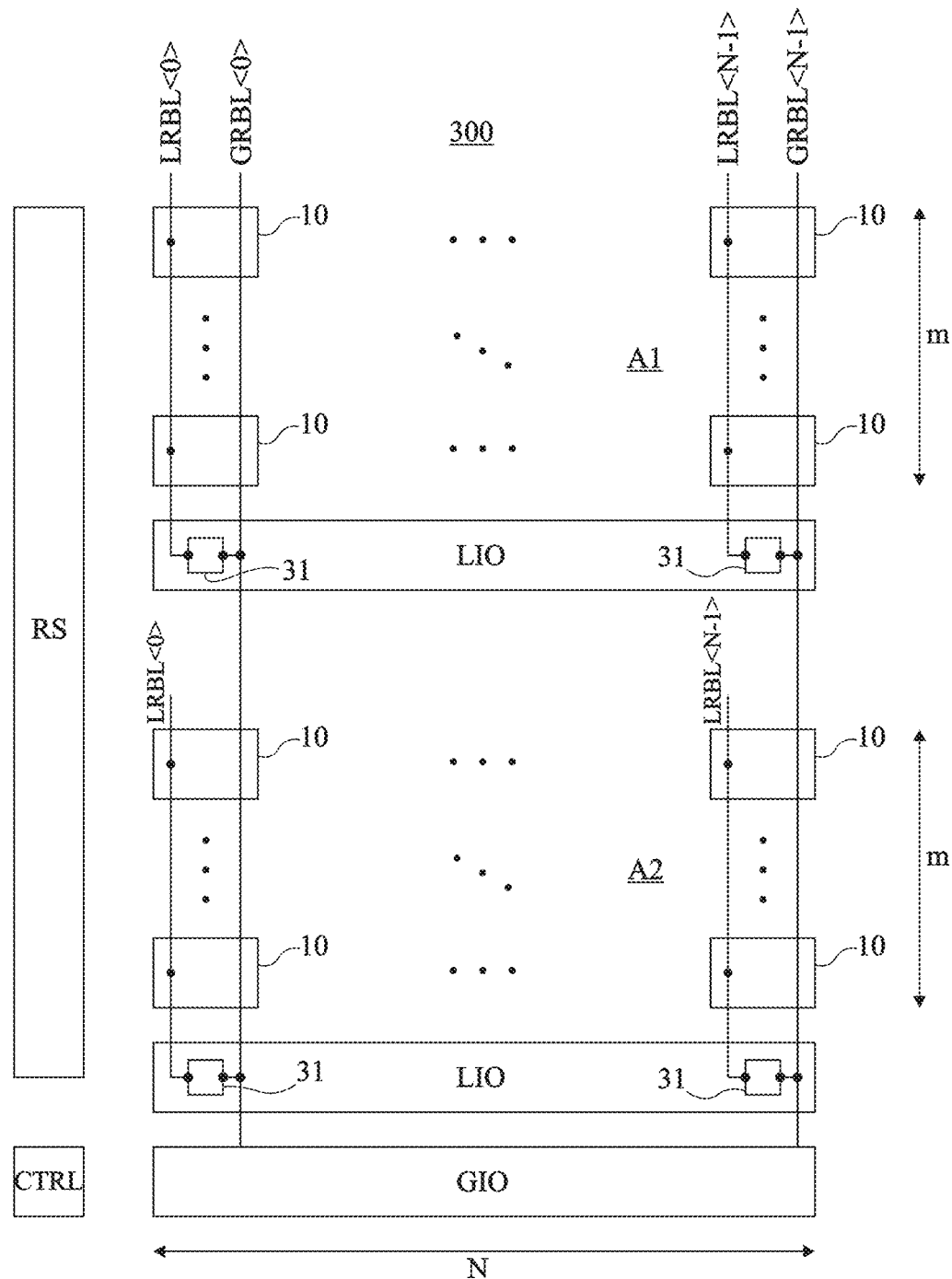
FIG. 3 schematically shows an example of a memory module according to an embodiment.

FIG. 3 schematically shows an example of a memory module 300 according to an embodiment, overcoming all or part of the above-mentioned disadvantages.

The memory module 300 of FIG. 3 comprises a plurality of elementary cells 10 distributed in two arrays A1 and A2 of m rows and N columns each, where m is an integer, preferably greater than or equal to 2. It will be within the abilities of those skilled in the art to adapt the example of FIG. 3 to form a memory module partitioned into a number of arrays greater than two.

In each of arrays A1 and A2 of memory module 300, the elementary cells 10 of a same column of the array are directly connected (with no intermediate connection circuit) to a same output conductive track or local read bit line LRBL of the array, it being understood that the elementary cells 10 of different columns are connected to different local read bit lines LRBL. In other words, for each column of rank j of the array, where j is an integer in the range from 0 to N−1, the array comprises a read bit line LRBL<j> specific to the column, interconnecting the cells in the column. Local read bit lines LBRL<j> correspond to the read bit lines RBL<j> of module 100 of FIG. 1, that is, to the read bit lines RBLT of the elementary cells 10 of FIG. 2.

For each of arrays A1 and A2, module 300 comprises a local input/output circuit LIO specific to the array, for example, arranged at one end of the columns of the array, having the local read bit lines LRBL<j> of the array connected thereto. The local read bit lines LRBL<j> of array A1 are however not directly connected to the local read bit lines LRBL<j> of array A2.

For each rank of column j of arrays A1 and A2, module 300 further comprises a conductive track GRBL<j> common to the cells of the columns of rank j of arrays A1 and A2, called general read bit line, having the local read bit lines LRBL<j> of arrays A1 and A2 connected thereto. Similarly to local read bit lines LRBL<j>, general read bit lines GRBL<j> extend in the column direction of arrays A1 and A2, that is, vertically in the orientation of FIG. 3.

For each of arrays A1 and A2 of the module, the local input/output circuit LIO associated with the array comprises, for each column of the array, a coupling circuit 31 coupling the local read bit line LRBL<j> of the column to the general read bit line GRBL<j> of this same column. Coupling circuit 31 is controllable to transfer a binary signal from local read bit line LRBL<j> to general read bit line GRBL<j> or to transfer a binary signal from general read bit line GRBL<j> to local read bit line LRBL<j> or to isolate local read bit line LRBL<j> from general read bit line GRBL<j>.

General read bit lines GRBL<j> are connected to a same general input/output circuit GIO of the module, common to arrays A1 and A2 of the module.

Module 300 further comprises a row selection circuit RS, for example, arranged at one end of the rows of the array.

Module 300 further comprises a control circuit CTRL capable of receiving instructions originating from a device external to the module, and of accordingly controlling the elementary cells 10 of the module via row selection circuit RS and/or via input/output circuits LIO and GIO of the module.

To perform a reading from an elementary cell 10 of module 300, the row of array A1 or A2 containing the cell is activated in read mode via row selection circuit RS of the module and the datum contained in the cell is transferred to the local read bit line LRBL<j> connected to the cell. Control circuit CTRL further controls the corresponding coupling circuit 31 to transfer the read datum onto the general read bit line GRBL<j> associated with the cell. The reading of the potential of general read bit line GRBL<j> via general input/output circuit GIO thus enables to determine the value of the data bit stored in the read cell.

To implement a calculation operation having as operands two bits stored in two cells of a same column of rank j of array A1 or A2 or in a cell of the column of rank j of array A1 and in a cell of the column of rank j of array A2, control circuit CTRL simultaneously activates in read mode (via row selection circuit RS) the two corresponding rows of the module.

If the selected rows belong to the same array A1 or A2 of the module, the calculation operation is carried out on the local read bit line LRBL<j> of the array similarly to what has been described hereabove in relation with FIGS. 1 and 2. Control circuit CTRL further controls the corresponding coupling circuit 31 to transfer the result of the operation onto the general read bit line GRBL<j> of the module. The result of the operation can thus be read via the general input/output circuit GIO of the module.

If the selected rows belong to different arrays of the module, control circuit CTRL controls the coupling circuit 31 associated with the column of rank j of array A1 to transfer onto general read bit line GRBL<j> the binary signal which establishes on the local read bit line LRBL<j> of array A1, and the coupling circuit 31 associated with the column of rank j of array A2 to transfer onto the general read bit line GRBL<j> the binary signal which establishes on the local read bit line LRBL<j> of array A2. The actual calculation operation, that is, the combination of the logic states present on the local read bit lines LRBL<j> of arrays A1 and A2, is then directly carried out on general read bit line GRBL<j>. The result of the operation can be read via the general input/output circuit GIO of the module.

Thus, memory module 300 of FIG. 3 has the advantage of being partitioned into a plurality of arrays, which provides a gain in terms of speed of access to the data stored in the memory, associated with a significant decrease in the dynamic power consumption, and enables to perform calculation operations having as operands data stored in different arrays of the module.

It should be noted that for certain operations, particularly to transfer data from array A1 to array A2, the control circuit may control the coupling circuit 31 associated with the column of rank j of array A1 to transfer onto the local read bit line LRBL<j> of array A1 the binary signal which establishes on general read bit line GRBL<j>.

Figure 4:
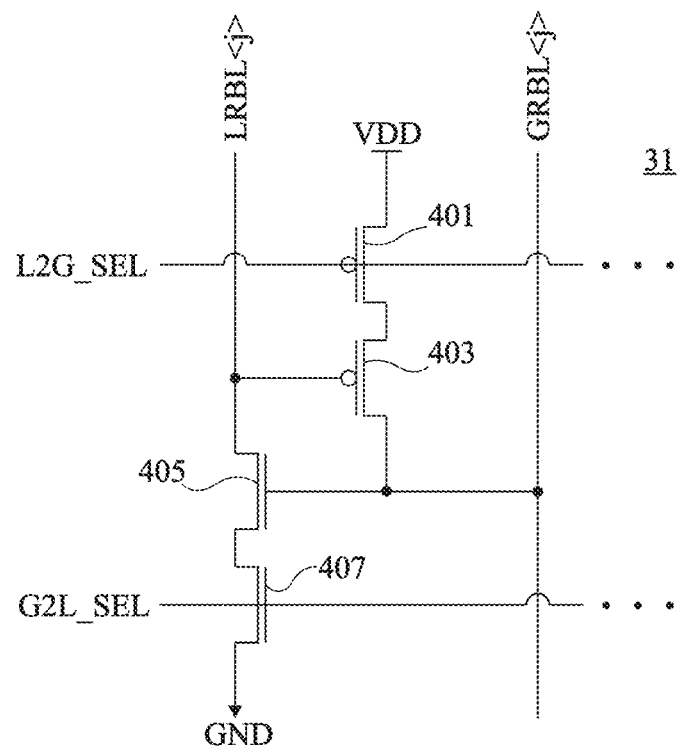
FIG. 4 is an electric diagram of an embodiment of a coupling circuit of the memory module of FIG. 3.

FIG. 4 is an electric diagram of an embodiment of a coupling circuit 31 of memory module 300 of FIG. 3.

Coupling circuit 31 of FIG. 4 comprises two transistors 401 and 403 series-connected, by their conduction nodes (source and drain) between a node VDD of application of the power supply voltage of the module and the general read bit line GRBL<j> having coupling circuit 31 associated therewith. More particularly, transistor 401 has a first conduction node connected to node VDD and a second conduction node connected to a first conduction node of transistor 403 and transistor 403 has a second conduction node connected to track GRBL<j>.

Coupling circuit 31 of FIG. 4 further comprises two transistors 405 and 407 series-connected, by their conduction nodes, between the local read bit line LRBL<j> having coupling circuit 31 associated therewith and a node GND of application of a reference potential to the module, for example, the ground. More particularly, transistor 405 has a first conduction node connected to track LRBL<j> and a second conduction node connected to a first conduction node of transistor 407, and transistor 407 has a second conduction node connected to node GND.

The gate of transistor 403 is connected to the first conduction node of transistor 405, that is, to track LRBL<j>, and the gate of transistor 405 is connected to the second conduction node of transistor 403, that is, to track GRBL<j>.

In this example, transistors 401 and 403 are P-channel MOS transistors and transistors 405 and 407 are N-channel MOS transistors.

The gate of transistor 401 is connected to a control conductive track L2G_SEL, and the gate of transistor 407 is connected to a control conductive track G2L_SEL. The coupling circuits 31 associated with a same array of the memory module are for example interconnected via their conductive tracks L2G_SEL on the one hand and via their conductive tracks G2L_SEL on the other hand.

Coupling circuit 31 may be controlled by control circuit CTRL of the module:
  to take a first configuration where transistor 401 is turned on by application of an adapted signal to track L2G_SEL and transistor 407 is maintained off by application of an adapted control signal to track G2L_SEL,
  to take a second configuration where transistor 401 is maintained off by application of an adapted signal to track L2G_SEL and transistor 407 is turned on by application of an adapted signal to track G2L_SEL, or
  to take a third configuration where transistors 401 and 407 are both maintained off.

During an operation of reading from an elementary cell of module 300, the local read bit line LRBL<j> of the column containing the cell is first precharged to a high level, for example to power supply voltage VDD of the module, and the general read bit line GRBL<j> of the column containing the cell is precharged to a low level, for example, to reference potential GND of the module. The row of array A1 or A2 containing the cell is then activated in read mode, so that local read bit line LRBL<j> discharges when the datum stored in the cell has a first binary value, for example, binary value '1', and remains charged when the datum stored in the cell has the opposite binary value, for example, binary value '0'. The discharge of local read bit line LRBL<j> results in turning on transistor 403, which causes the charge of the general read bit line GRBL<j> of the column to potential VDD. If, however, local read bit line LRBL<j> remains charged, transistor 403 is maintained off and general read bit line GRBL<j> remains substantially at potential GND. Thus, the binary signal carried by local read bit line LRBL<j> is effectively transmitted (inverted in the present example) over general read bit line GRBL<j> and can thus be read by the general input/output circuit GIO of the module.

During a calculation operation having as operands two bits stored in two cells of a same column of rank j of array A1 or A2 of the module, the local read bit line LRBL<j> of the array containing the cells is first precharged to a high level, and general read bit line GRBL<j> is precharged to a low level. The rows of array A1 or A2 containing the cells are then activated simultaneously in read mode, so that the potential of local read bit line LRBL<j> takes a high or low state according to the result of the logic operation performed between the two cells. If local read bit line LRBL<j> discharges, transistor 403 turns on, which causes the charge of the general read bit line GRBL<j> of the column to potential VDD. If, however, local read bit line LRBL<j> remains charged, transistor 403 is maintained off and general read bit line GRBL<j> remains substantially at potential GND. Thus, the binary signal carried by local read bit line LRBL<j>, corresponding to the result of the logic operation carried out between the two activated cells, is effectively transmitted (inverted in the present example) over general read bit line GRBL<j> and can thus be read by the general input/output circuit GIO of the module.

During a calculation operation having as operands two bits respectively stored in a cell of a column of rank j of array A1 and in a cell of a column of same rank j of array A2, the local read bit line LRBL<j> of array A1 and the local read bit line LRBL<j> of array A2 are first precharged to a high level, and general read bit line GRBL<j> is precharged to a low level. The rows of arrays A1 and A2 containing the cells are then simultaneously activated in read mode. In each of arrays A1 and A2, local read bit line LRBL<j> discharges or remains charged according to the value stored in the selected cell. If at least one of the two local read bit lines LRBL<j> discharges, the transistor 403 of the corresponding coupling circuit 31 turns on, and general read bit line GRBL<j> charges to potential VDD. If the two local read bit lines LRBL<j> remain charged, the transistors 403 of the corresponding coupling circuits 31 remain off, and general read bit line GRBL<j> remains substantially at potential GND. Thus, the binary signal carried by general read bit line GRBL<j> effectively corresponds to the result of a logic operation performed between the two activated cells. This signal can be read by the general input/output circuit GIO of the module.

To enable to rewrite the result of a calculation or read operation without having the calculated or read data transit through circuits external to the memory module, and particular over a data bus external to the module, each local input/output circuit LIO of the memory module may comprise an internal redirection circuit (not detailed) enabling to couple the local read bit line(s) of each column of the corresponding array to a data write bit line of the column and/or of another column of the array, for example, to the conductive track WBLT and/or to the conductive track WBLF of the column or of another column of the array.

An embodiment of a memory module partitioned into a plurality of arrays, the module being capable of implementing calculation operations having as operands data stored in different arrays of the module, has been described in relation with FIGS. 3 and 4. However, in certain applications, a memory circuit may comprise a plurality of memory modules, for example, identical or similar, for example, modules of the type described in relation with FIG. 1 or modules of the type described in relation with FIG. 3. Here again, this enables to achieve a partitioning of the memory and thus to limit the times of access to the elementary cells of the memory circuit while minimizing the dynamic power consumption. However, a disadvantage is that it is then only possible to perform calculation operations between data contained in a same module. An embodiment of a memory circuit comprising a plurality of memory modules, this circuit enabling to implement calculation operations having as operands data stored in different modules of the memory circuit, will now be described in relation with FIGS. 5, 6, and 7.

Figure 5:
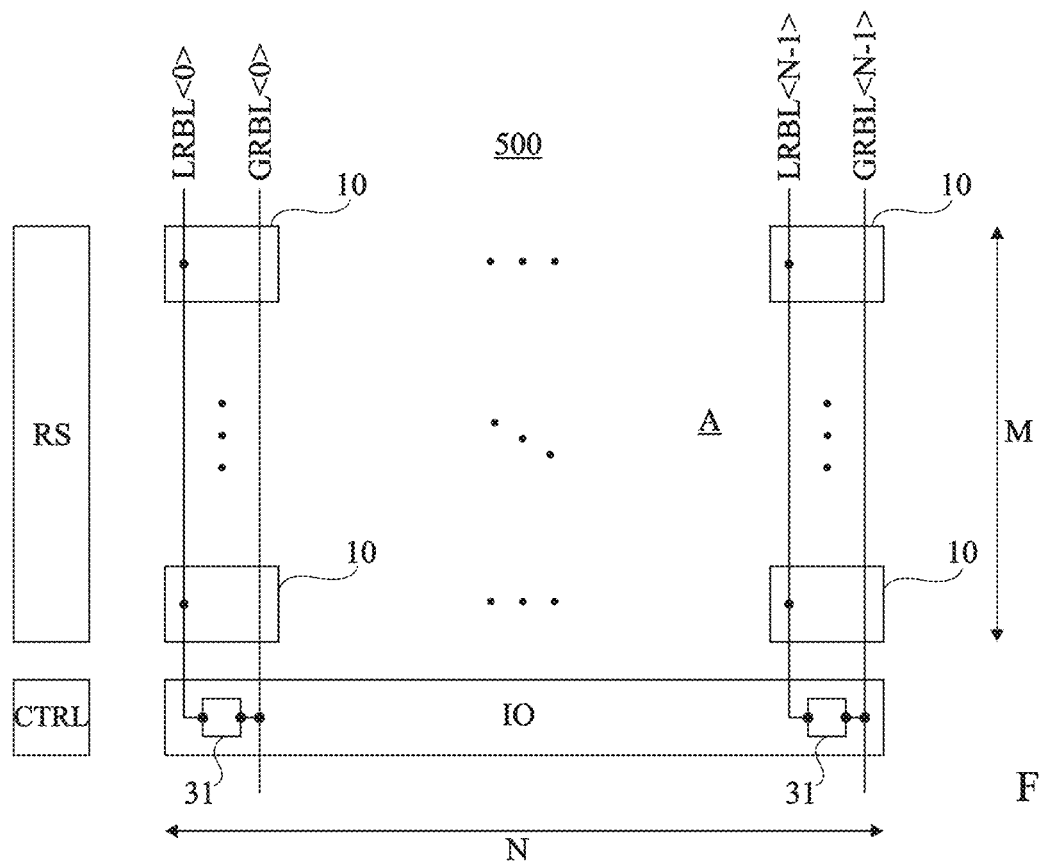
FIG. 5 schematically shows another example of a memory module according to an embodiment.

FIG. 5 schematically shows an example of a memory module 500 according to an embodiment.

In the example of FIG. 1, memory module 500 comprises a plurality of elementary cells 10 arranged in an array A of M rows and N columns. Further, as in the previous examples, the elementary cells 10 of a same column of array A are directly connected to a same output conductive track or local read bit line LRBL of the array, it being understood that the elementary cells 10 of different columns are connected to different local read bit lines LRBL. In other words, for each column of rank j of the array, where j is an integer in the range from 0 to N−1, array A comprises a read bit lines LRBL<j> specific to the column, interconnecting the column cells. Local read bit lines LBRL<j> correspond to the read bit lines RBL<j> of module 100 of FIG. 1, that is, to the read bit lines RBLT of the elementary cells 10 of FIG. 2.

Module 500 further comprises an input/output circuit IO, for example, arranged at one end of the columns of the array, having the local read bit lines LRBL<j> of the array connected thereto.

For each column of rank j of array A, module 500 further comprises a conductive track GRBL<j> called general read bit line, having the local read bit line LRBL<j> of the columns coupled thereto via a coupling circuit 31.

More particularly, for each column of array A, the input/output circuit IO of the module comprises a coupling circuit 31, for example, identical to the coupling circuit 31 described hereabove in relation with FIGS. 3 and 4, coupling the local read bit line LRBL<j> of the column to the general read bit line GRBL<j> of this same column.

Module 500 further comprises a row selection circuit RS, for example, arranged at one end of the rows of the array.

Module 500 further comprises a control circuit CTRL capable of receiving instructions originating from a device external to the module, and of accordingly controlling the elementary cells 10 of the module via row selection circuit RS and/or via input/output circuit IO of the module.

Figure 6:
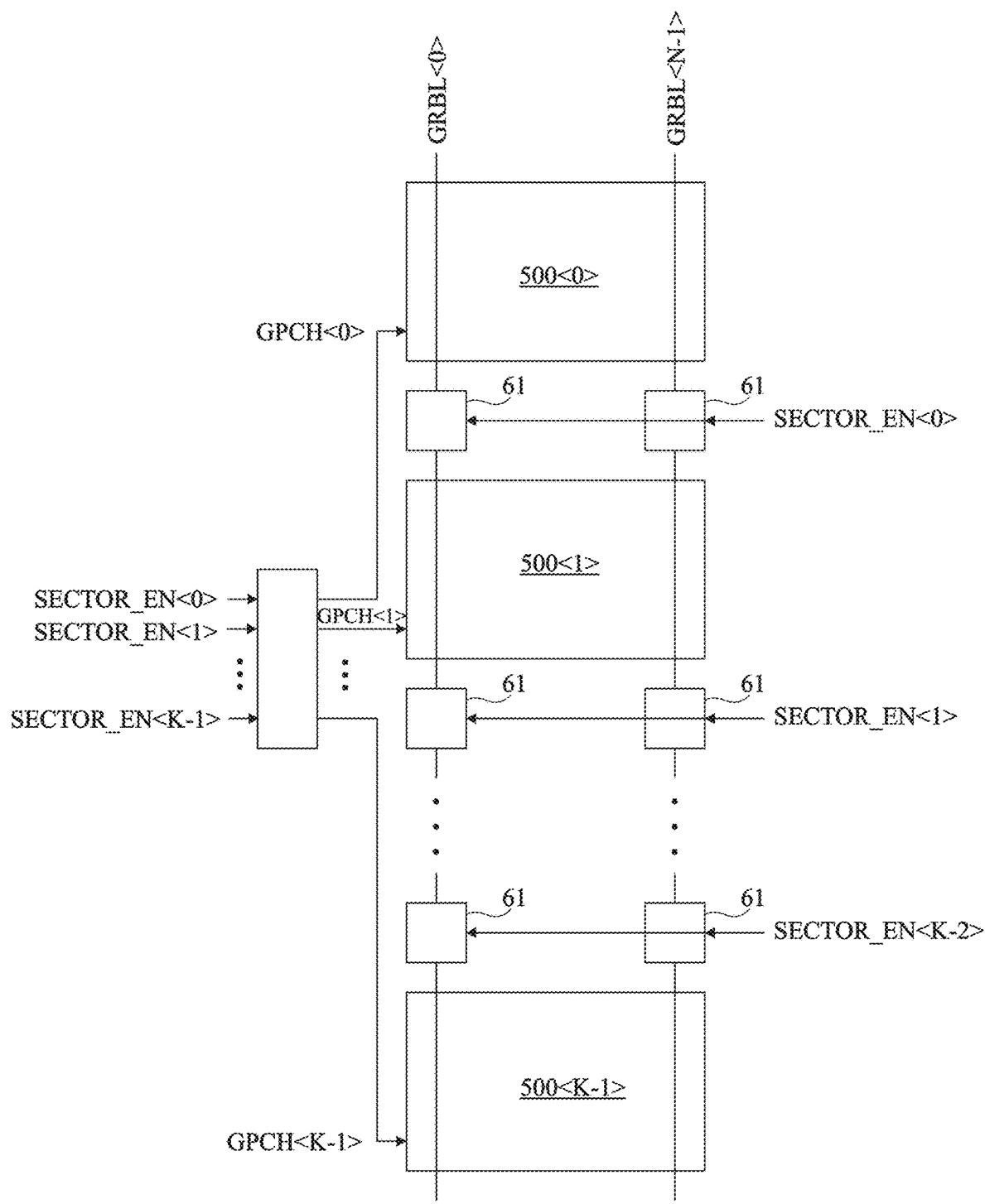
FIG. 6 schematically shows an example of a memory circuit comprising a plurality of memory modules of the type described in relation with FIG. 5.

FIG. 6 schematically shows an example of a memory circuit comprising a plurality of memory modules of the type described in relation with FIG. 5. More particularly, in the shown example, the memory circuit comprises K memory modules 500<l>, K being an integer greater than or equal to 2 and l being an integer in the range from 0 to K−1. For simplification, only the general read bit lines GRBL<j> of the different modules have been detailed in FIG. 6.

For each column rank j, the general read bit lines GRBL<j> of the different memory modules 500 are coupled in series via coupling circuits 61. More particularly, for each column rank j, for each memory module 500<l> except for modules 500<0> and 500<K−1>, the general read bit line GRBL<j> of module 500<l> has a first end coupled to an end of the general read bit line GRBL<j> of module 500<l−1> by a first coupling circuit 61 and a second end coupled to an end of general read bit line GRBL<j> of module 500<l+1> by a second coupling circuit 61. Thus, in this example, the memory circuit comprises (K−1)*N coupling circuits 61, for example, identical or similar, coupling in an open chain memory modules 500<0> to 500<K−1>. The free end of module 500<0> and the free end of module 500<K−1> may be coupled to peripheral input/output circuits of the memory circuit.

For each column rank j, and for each memory module 500<l> except for module 500<K−1>, the coupling circuit 61 coupling the general read bit line GRBL<j> of module 500<l> to the general read bit line GRBL<j> of module 500<l+1> is controllable either to isolate the bit line GRBL<j> of module 500<l> from the bit line GRBL<j> of module 500<l+1>, or to copy (possibly by amplifying it and/or by rectifying it and/or by buffering it—that is, by temporarily storing it) on the bit line GRBL<j> of module 500<l+1> a binary signal present on the bit line GRBL<j> of module 500<l>, or to copy (possibly by amplifying it) on the bit line GRBL<j> of module 500<l> a binary signal present on the bit line GRBL<j> of module 500<l+1>.

In the example of FIG. 6, for each memory module 500<l> except for module 500<K−1>, the N coupling circuits 61 coupling module 500<l> to module 500<l+1> are simultaneously controllable via a same control signal SECTOR_EN<l>.

The memory circuit of FIG. 6 may comprise a general control circuit (not shown) capable of controlling modules 500<l> and coupling circuits 61.

To perform a reading from an elementary cell 10 of the memory circuit of FIG. 6, the row of array A of module 500<l> containing the cell is activated in read mode via the row selection circuit RS of the module and the data contained in the cell are transferred to the local read bit line LRBL<j> connected to the cell. The datum is then read by the input/output circuit IO of module 500<l>. During this operation, the coupling circuit 31 connected to the local read bit line LBRL<j> of module 500<l> may be controlled to isolate the local read bit line LRBL<j> of module 500<l> from the general read bit line GRBL<j> of module 500<l>, and the coupling circuits 61 of the memory circuit may be controlled to isolate from one another the general read bit lines GRBL<j> of the different modules. As a variation, the control circuit CTRL of the module controls the coupling circuit 31 coupling the local read bit line LRBL<j> of the module to the general read bit line GRBL<j> of the module to transfer to line GRBL<j> of the module the signal present on the line LRBL<j> of the module (with an inversion of the signal in the case of the coupling circuit 31 of FIG. 4). The coupling circuit(s) 61 coupling the general read bit line GRBL<j> of module 500<l> to the peripheral input/output circuits of the memory circuit, that is, to the free end of the general read bit line GRBL<0> of the module 500<0> or to the free end of the general read bit line GRBL<K−1> of module 500<K−1> in the present example, are further controlled to transfer to the peripheral input/output circuits the binary signal present on the general read bit line GRBL<j> of module 500<l>. The datum can then be read by the peripheral input/output circuits of the memory circuit.

To carry out a calculation operation having as operands two bits stored in two cells of a same column of rank j of a module 500<l> of the memory circuit of FIG. 6, the control circuit CTRL of module 500<l> simultaneously activates in read mode the corresponding rows of the module. The calculation operation is then carried out on the local read bit line LRBL<j> of the module similarly to what has been described hereabove, and the result of the operation may be read by the input/output circuit IO of the module. During this operation, the coupling circuit 31 connected to the local read bit line LBRL<j> of module 500<l> may be controlled to isolate the local read bit line LRBL<j> of module 500<l> from the general read bit line GRBL<j> of module 500<l>, and the coupling circuits 61 of the memory circuit may be controlled to isolate from one another the general read bit lines GRBL<j> of the different modules. As a variation, the control circuit CTRL of the module controls the coupling circuit 31 coupling the local read bit line LRBL<j> of the module to the general read bit line GRBL<j> of the module to transfer to line GRBL<j> of the module the signal present on line LRBL<j> of the module (with an inversion of the signal in the case of the coupling circuit 31 of FIG. 4). The coupling circuit(s) 61 coupling the general read bit line GRBL<j> of module 500<l> to the peripheral input/output circuits of the memory circuit, that is, to the free end of the general read bit line GRBL<0> of the module 500<0> or to the free end of the general read bit line GRBL<K−1> of module 500<K−1> in the present example, are further controlled to transfer to the peripheral input/output circuits the binary signal present on the general read bit line GRBL<j> of module 500<l>. The result of the operation can then be read by the peripheral input/output circuits of the memory circuit.

To perform a calculation operation having as operands two bits stored in two cells respectively belonging to a column of rank j of a module 500<l> and to a column of same rank j of a module 500<l'>, l' being an integer in the range from 0 to K−1 and l' being different from l, the control circuits CTRL of modules 500<l> and 500<l'> simultaneously activate in read mode the corresponding rows of modules 500<l> and 500<l'>. Further, in one of the two modules, for example, module 500<l>, the control circuit CTRL of the module controls the coupling circuit 31 coupling the local read bit line LRBL<j> of the module to the general read bit line GRBL<j> of the module to transfer to line GRBL<j> of the module the signal present on line LRBL<j> of the module (with an inversion of the signal in the case of the coupling circuit 31 of FIG. 4). The coupling circuit(s) 61 coupling the general read bit line GRBL<j> of module 500<l> to the general read bit line GRBL<j> of module 500<l'> are further controlled to copy onto the general read bit line GRBL<j> of module 500<l'> the binary signal present on the general read bit line GRBL<j> of module 500<l>. Further, in module 500<l'>, the control circuit CTRL of the module controls the coupling circuit 31 coupling the general read bit line GRBL<j> of the module to the local read bit line LRBL<j> of the module to transfer to bit line LRBL<j> of the module the binary signal present on the bit line GRBL<j> of the module (with an inversion of the signal in the case of the coupling circuit 31 of FIG. 4). The calculation operation is then carried out on the local read bit line LRBL<j> of module 500<l'>, and the result of the operation may be read by the input/output circuit IO of module 500<l'>. During this operation, the coupling circuits 61 connected to the general read bit lines GRBL<j> of modules 500 which are not on the path of the operation (that is, which are not between modules 500<l> and 500<l'>), may be controlled to the off state (that is, electrically isolating from one another the general read bit lines GRBL<j> that they couple). As a variation, the actual calculation operation is carried out on a general read bit line, for example, the general read bit line GRBL<j> of module 500<l'>. To achieve this, in each of modules 500<l> and 500<l'>, the coupling circuit 31 of the module is controlled to transfer onto the general read bit line GRBL<j> of the module the signal present on its local read bit line LRBL<j>, and the coupling circuit(s) separating the general read bit line GRBL<j> of module 500<l> from the GRBL<j> of module 500<l'> are controlled to transfer onto the general read bit line GRBL<j> of module 500<l'> the signal present on the general read bit line GRBL<j> of module 500<l>. The coupling circuit(s) 61 coupling the general read bit line GRBL<j> of module 500<l'> to the peripheral input/output circuits of the memory circuit are further controlled to transfer to the peripheral input/output circuits the binary signal present on the general read bit line GRBL<j> of module 500<l'>. The result of the operation can then be read by the peripheral input/output circuits of the memory circuit. It should further be noted that in the memory modules 500 which are not concerned by the operation, that is, the general read bit lines GRBL<j> of which are not used to transmit operand data or result data, the general read bit lines GRBL<j> may be maintained at their precharge potential for all the duration of the operation. This enables to avoid having to precharge them again during the next operation, and thus to increase the operating speed of the memory circuit, as well as to minimize the dynamic power consumption. In the example of FIG. 6, the memory circuit comprises for this purpose a logic circuit 601 receiving control signals SECTOR_EN<0>, . . . SECTOR_EN<K−2> of coupling circuits 61, and supplying each module 500<l> with a precharge control signal GPCH<l>. When module 500<l> is not on the path of the operation, the signal GPCH<l> supplied by circuit 601 is in a first state such that the control circuit CTRL of module 500<l> controls the maintaining of the precharge of the general read bit lines GRBL<j> of the module for the entire duration of the operation. When module 500<l> is on the path of the operation, the signal GPCH<l> supplied by circuit 601 is in a second state such that the control circuit CTRL of module 500<l> controls the interruption of the application of the potential of precharge of the general read bit lines GRBL<j> of the module to leave them floating and to enable the implementation of the operation.

It should be noted that although FIG. 6 shows an embodiment where memory modules 500 are coupled two by two in series via coupling circuits 61, the described embodiments are not limited to this specific case. As a variation, memory modules 500 may be distributed into a plurality of groups of a plurality of modules 500 per group, the modules of a same group being directly series-connected via their general read bit lines GRBL<j>, and the groups of modules being coupled in series via coupling circuits 61.

To enable to rewrite the result of a calculation or read operation without having the calculated or read data transit through circuits external to the memory circuit, and particular over a data bus external to the memory circuit, each local input/output circuit IO (FIG. 5) of the memory circuit may comprise an internal redirection circuit (not detailed) enabling to couple the local read bit line(s) of each column of the corresponding array to a data write bit line of the column and/or of another column of the array, for example, to the conductive track WBLT and/or to the conductive track WBLF of the column or of another column of the array.

Figure 7:
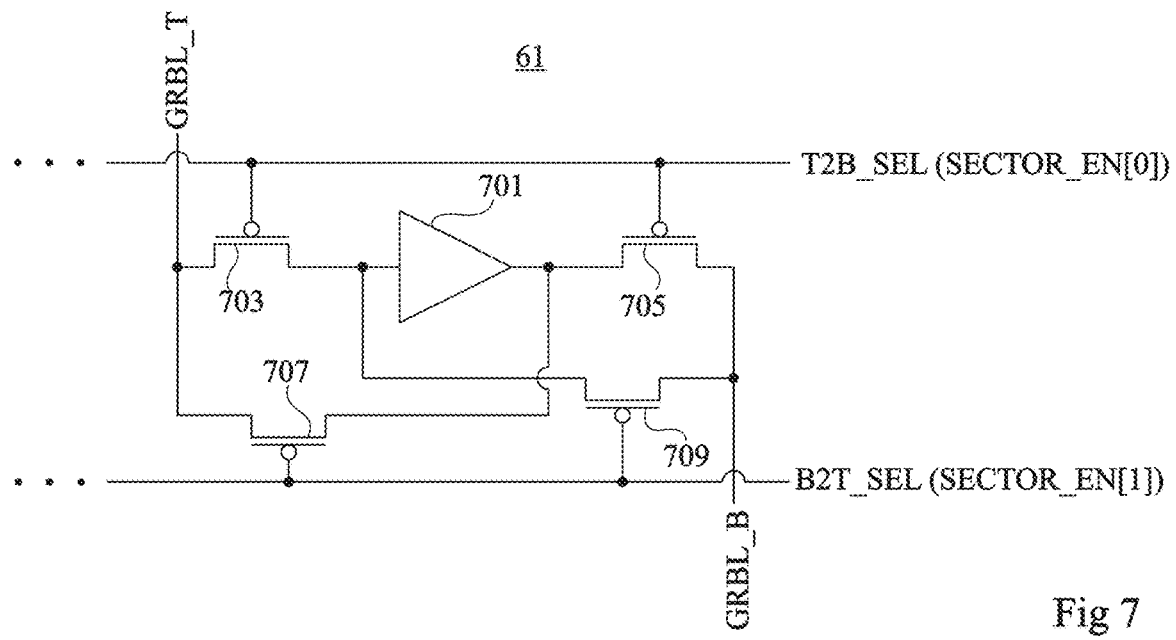
FIG. 7 is an electric diagram of an embodiment of a coupling circuit of the memory circuit of FIG. 6.

FIG. 7 is an electric diagram of an embodiment of a coupling circuit 61 of the memory circuit of FIG. 6 coupling a general read bit line GRBL<j> of a module 500 of a memory circuit, designated with reference GRBL_T in FIG. 7, to a general read bit line GRBL<j> of same rank j of a neighboring module 500, designated with reference GRBL_B in FIG. 7.

Coupling circuit 61 comprises an amplifier (or a buffer or inverter) 701 having an input coupled to conductive track GRBL_T by a transistor 703 and an output coupled to conductive track GRBL_B by a transistor 705. The circuit 61 of FIG. 7 further comprises a transistor 707 coupling conductive track GRBL_T to the output of amplifier 701, and a transistor 709 coupling conductive track GRBL_B to the input of amplifier 701. In this example, transistors 703, 705, 707, and 709 are P-channel MOS transistors. The gates of transistors 703 and 705 are connected to a same first control conductive track T2B_SEL of circuit 61, and the gates of transistors 707 and 709 are connected to a same control conductive track B2T_SEL of circuit 61.

In this example, signal SECTOR_EN for controlling coupling circuit 61 is a signal over two bits, respectively designated with reference numerals SECTOR_EN[0] and SECTOR_EN[1], respectively applied to conductive tracks T2B_SEL and B2T_SEL of the circuit.

In a first configuration (signals SECTOR_EN[0] and SECTOR_EN[1] respectively in the low state and in the high state in the present example), transistors 703 and 705 are on and transistors 707 and 709 are off, so that circuit 61 copies on bit line GRBL_B the binary signal present on bit line GRBL_T.

In a second configuration (signals SECTOR_EN[0] and SECTOR_EN[1] respectively in the high state and in the low state in the present example), transistors 707 and 709 are on and transistors 703 and 705 are off, so that circuit 61 copies on bit line GRBL_T the binary signal present on bit line GRBL_B.

In a third configuration (signals SECTOR_EN[0] and SECTOR_EN[1] in the high state in this example), transistors 703, 705, 707, and 709 are off, so that circuit 61 isolates bit line GRBL_B from bit line GRBL_T.

It should be noted that in this example, the fourth configuration (signals SECTOR_EN[O] and SECTOR_EN[1] in the low state) is never used (forbidden configuration).

Figure 8:
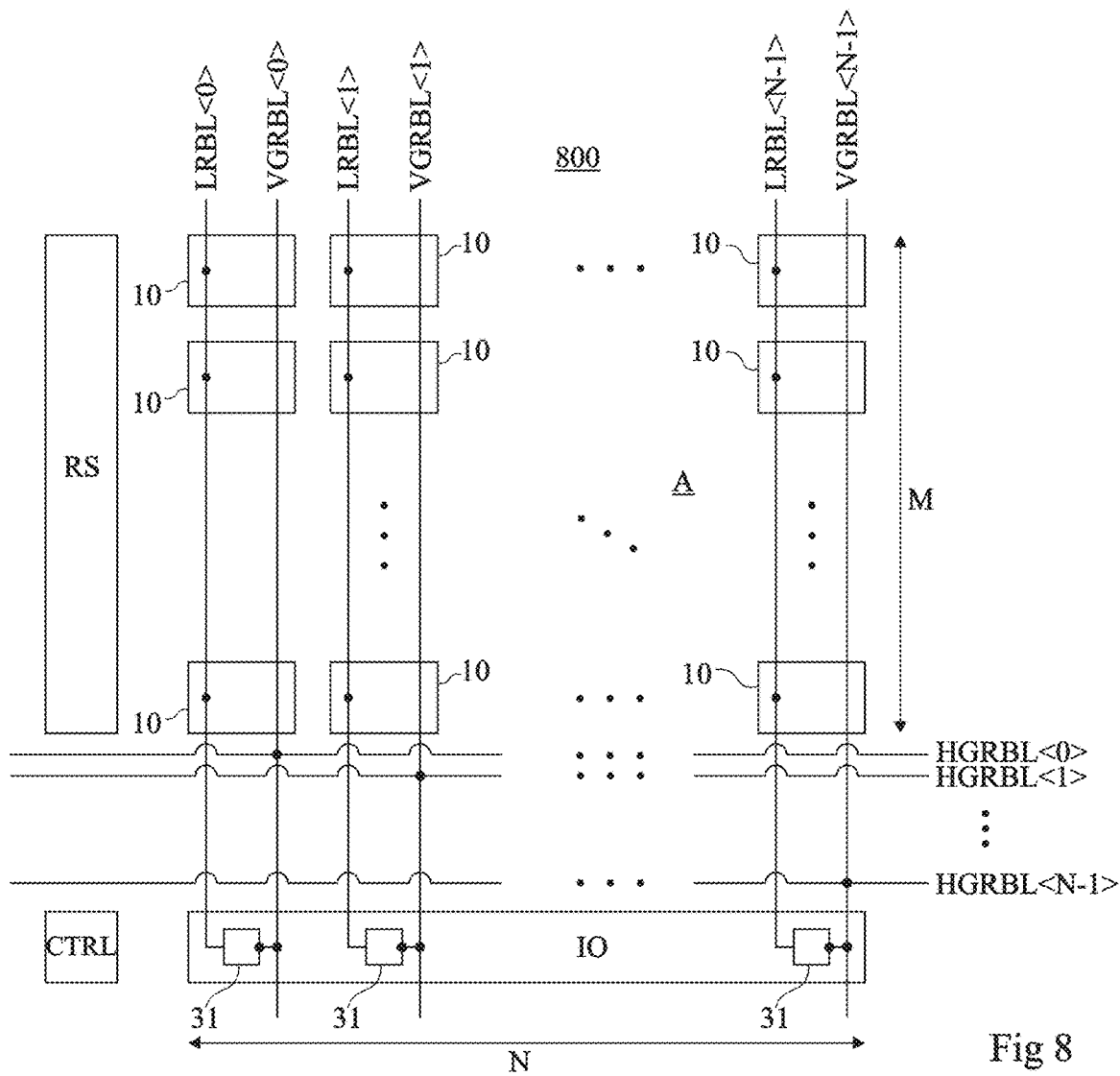
FIG. 8 schematically shows another example of a memory module according to an embodiment.

FIG. 8 schematically shows another example of a memory module 800 according to an embodiment.

Memory module 800 of FIG. 8 comprises the same elements as memory module 500 of FIG. 5, arranged substantially in the same way. It should however be noted that the general read bit lines GRBL<0> to GRBL<N–1> of memory module 500 of FIG. 5 are respectively designated with references VGRBL<0> to VGRBL<N–1> in FIG. 8.

As previously indicated, local read bit lines LRBL<j> and general read bit lines VGRBL<j> extend along the direction of the columns of array A, that is, vertically in the orientation of FIG. 8. This enables to form a memory circuit comprising a plurality of memory modules arranged in a strip as described in relation with FIG. 6.

In the example of FIG. 8, module 800 further comprises, for each column of rank j of array A, a second general read bit line HGRBL<j> common to the cells of the column, arranged according to an orientation parallel to the array rows, that is, horizontally in the orientation of FIG. 8. For each column of rank j, the horizontal general read bit line HGRBL<j> associated with the column is directly connected to the vertical general read bit line VGRHB<j> associated with this same column.

In the shown example, the horizontal general read bit lines HGRBL<0> to HGRBL<N–1> are arranged on the side of an end of the columns of array A, that is, they do not extend above array A. As a variation (not shown), the horizontal general read bit lines HGRBL<0> to HGRBL<N–1> may be arranged above array A.

Figure 9:
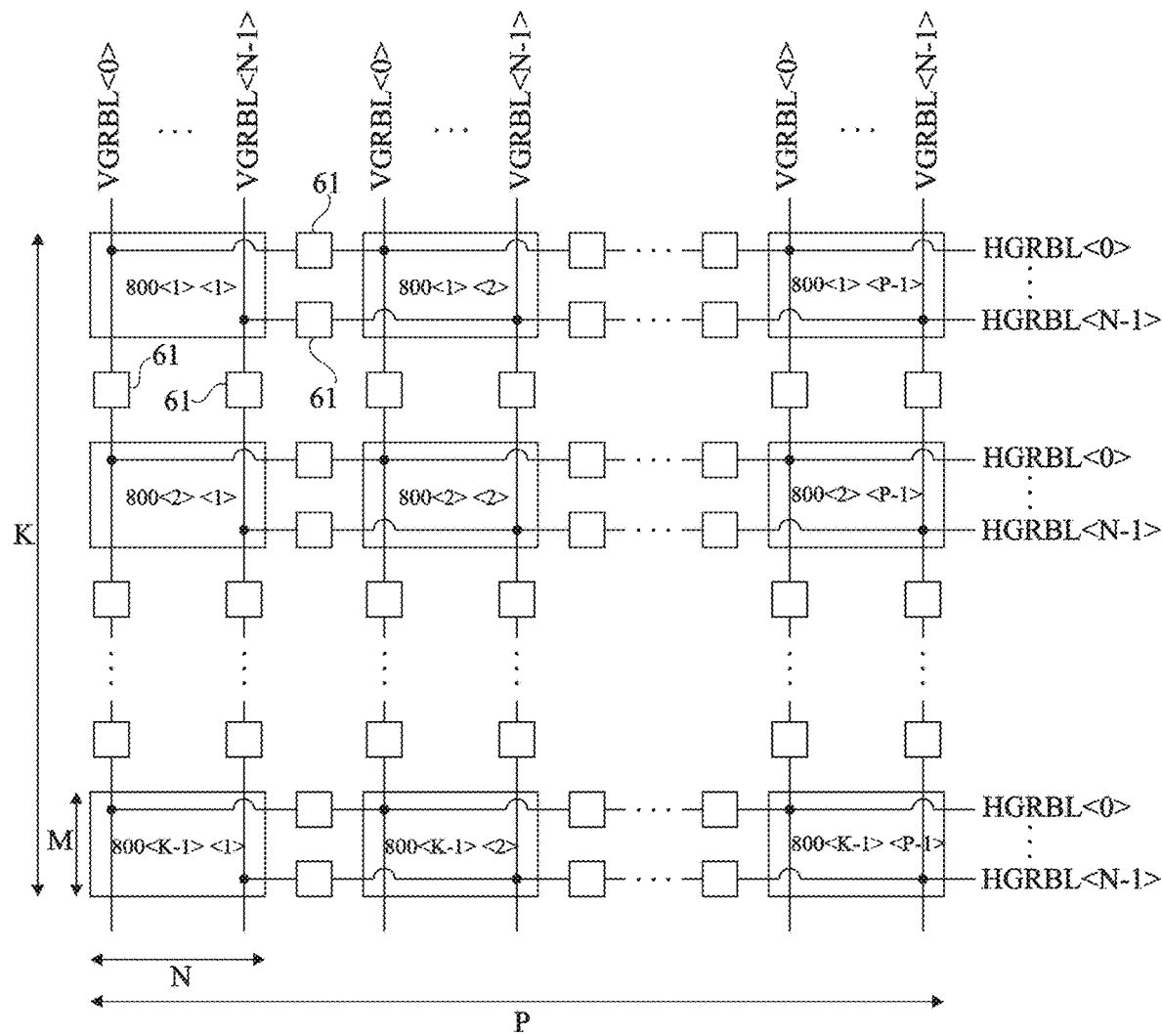
FIG. 9 schematically shows an example of a memory circuit comprising a plurality of memory modules of the type described in relation with FIG. 8.

An advantage resulting from the provision of the horizontal general read bit lines HGRBL<0> to HGRBL<N–1> is that this enables to form a memory circuit comprising a plurality of memory modules arranged in an array of rows and columns as shown in FIG. 9.

FIG. 9 schematically shows an example of a memory circuit comprising a plurality of memory modules of the type described in relation with FIG. 8. More particularly, in the shown example, the memory circuit comprises K*P memory modules 800<l><q>, arranged in an array of K rows and P columns, K and P being integers greater than or equal to 2, l being an integer from 0 to K–1 designating the rank of the row to which the module belongs, and q being an integer in the range from 0 to P–1 designating the rank of the column to which the module belongs.

For simplification, only the vertical and horizontal general read bit lines VGRBL<j> and HGRBL<j> of the different modules have been detailed in FIG. 9.

In each column of rank q of the memory circuit, for each column rank j of the memory modules 800 of the columns, the vertical general read bit lines VGRBL<j> of the different memory modules 800 of the column are coupled in series via coupling circuits 61 similarly to what has been described in relation with FIG. 6. More particularly, in each column of rank q of the memory circuit, for each column rank j of the memory modules 800 of the column, for each memory module 800<l><q> except for modules 500<0><q> and 500<K–1><q>, the vertical general read bit line VGRBL<j> of module 800<l><q> has a first end coupled to an end of the general read bit line VGRBL<j> of module 800<l–1><q> by a first coupling circuit 61 and a second end coupled to an end of the general read bit line VGRBL<j> of module 800<l+1><q> by a second coupling circuit 61.

Further, in each row of rank 1 of the memory circuit, for each column rank j of the memory modules 800 of the column, the horizontal general read bit lines HGRBL<j> of the different memory modules 800 in the row are coupled in series via coupling circuits 61. More particularly, for each row of rank 1 of the memory circuit, for each column rank j of the memory modules 800 in the row, for each memory module 800<l><q> except for modules 500<l><0> and 500<l><P–1>, the horizontal general read bit line HGRBL<j> of module 800<l><q> has a first end coupled to an end of general read bit line HGRBL<j> of module 800<l><q–1> by a first coupling circuit 61 and a second end coupled to an end of general read bit line HGRBL<j> of module 800<l><q+1> by a second coupling circuit 61.

Thus, in this example, the memory circuit comprises ((K−1)*N*P)+((P−1)*N*K) coupling circuits 61, for example, identical or similar, for example, coupling circuits of the type described in relation with FIG. 7.

An appropriate control of coupling circuits 61 enables to implement calculation operations having as operands data stored in different modules of the device, whatever the positions of said modules in the circuit.

Figure 10:
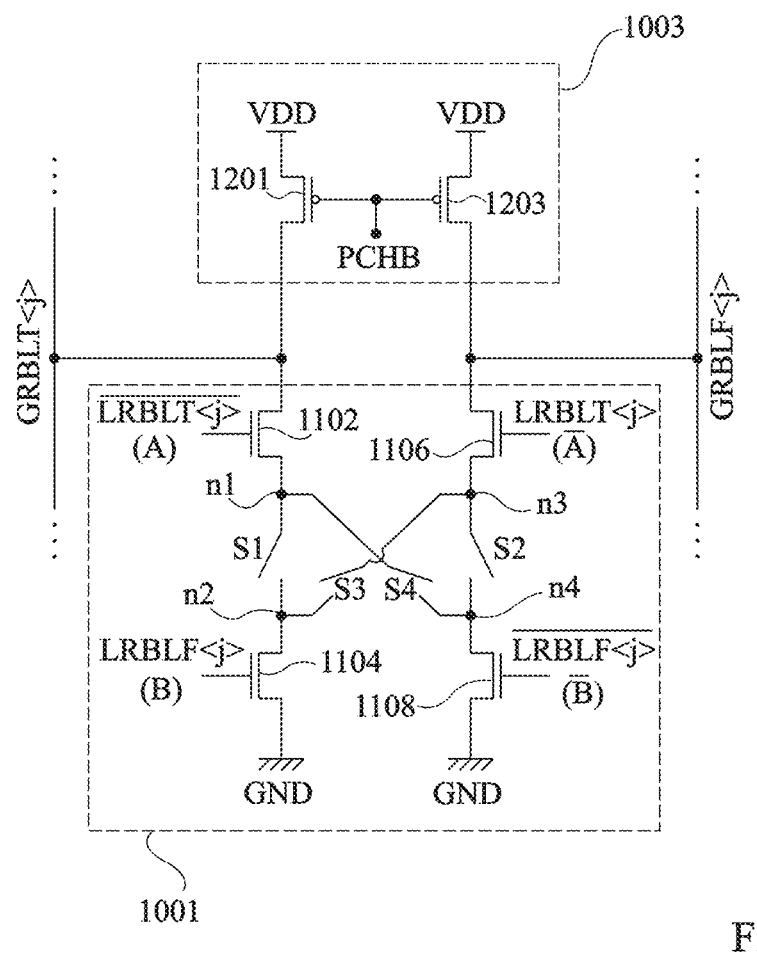
FIG. 10 illustrates a variation of a memory module according to an embodiment.

FIG. 10 illustrates a variation of a memory module according to an embodiment.

A memory module of the type described in relation with FIG. 3 or 5 is considered in the present example. A memory module having, as elementary cells 10, cells with two read bit lines LRBLT and LRBLF, for example, of the type described relation with FIG. 2, is more particularly considered in the present example. For each column rank j of the array(s) of the module, the module comprises two general read bit lines GRBLT<j> and GRBLF<j>. Each local read bit line LRBLT<j> is coupled to the corresponding general read bit line GRBLT<j> by a coupling circuit 31, for example, of the type described in relation with FIG. 4. Further, each local read bit line LRBLF<j> is coupled to the corresponding general read bit line GRBLF<j> by a coupling circuit 31, for example, of the type described in relation with FIG. 4.

In the variation of FIG. 10, the memory circuit further comprises, for each column of rank j of the array(s) of the module, an additional coupling circuit 1001, connected on the one hand to the local read bit lines LRBLT<j> and LRBLF<j> of the column and on the other hand to the general read bit lines GRBLT<j> and GRBLF<j> of the column. Additional coupling circuit 1001 is capable of implementing logic calculation operations having as operands binary data applied to the local read bit lines LRBLT<j> and LRBLF<j> of the column, and of delivering the results of these operations onto the general read bit lines GRBLT<j> and GRBLF<j> of the column. In FIG. 10, only one additional coupling circuit 1001 of the module has been shown, as well as a circuit 1003 for precharging the general read bit lines GRBLT<j> and GRBLF<j> connected to circuit 1001.

The additional coupling circuit 1001 of FIG. 10 comprises a transistor 1102, for example, an N-channel MOS transistor, coupling by its conduction nodes general read bit line GRBLT<j> to an intermediate node n1 of the circuit. Circuit 1001 further comprises a transistor 1104, for example, an N-channel MOS transistor, coupling by its conduction nodes an intermediate node n2 of the circuit to a node of application of low power supply potential GND of the module. Circuit 1001 further comprises a transistor 1106, for example, an N-channel MOS transistor, coupling by its conduction nodes general read bit line GRBLF<j> to an intermediate node n3 of the circuit. Circuit 1001 further comprises a transistor 1108, for example, an N-channel MOS transistor, coupling by its conduction nodes an intermediate node n4 of the circuit to a node of application of the low power supply potential GND of the module. The gate of transistor 1106 is coupled, for example, connected, to the local read bit line LRBLT<j> connected to circuit 1001. The gate of transistor 1104 is coupled, for example, connected, to the local read bit line LRBLF<j> connected to circuit 1001. The gate of transistor 1102 is coupled, for example, connected, to a node $\overline{\text{LRBLT}<j>}$ supplying a binary signal complementary to the binary signal carried by local read bit line LRBLT<j>. As an example, node $\overline{\text{LRBLT}<j>}$ is an input node of an inverter (not shown) having its input coupled to local read bit line LRBLT<j>. The gate of transistor 1108 is coupled, for example, connected, to a node $\overline{\text{LRBLT}<j>}$ for supplying a binary signal complementary to the binary signal carried by local read bit line LRBLF<j>. As an example, node $\overline{\text{LRBLT}<j>}$ is an input node of an inverter (not shown) having its input coupled to local read bit line LRBLF<j>. Circuit 1001 of FIG. 10 further comprises a first switch S1 coupling node n1 to node n2, a second switch S2 coupling node n3 to node n4, a third switch S3 coupling node n2 to node n3, and a fourth switch S4 coupling node n1 to node n4.

In this example, precharge circuit 1003 comprises a transistor 1201, for example, a P-channel MOS transistor, coupling, by its conduction nodes, a node of application of the high power supply potential VDD of the module to general read bit line GRBLT<j>, and a transistor 1203, for example, a P-channel MOS transistor, coupling, by its conduction nodes, the node of application of high power supply potential VDD of the module to general read bit line GRBLF<j>. In the shown example, transistors 1201 and 1203 have their control gates connected to a same control node PCHB of the precharge circuit.

The additional coupling circuit 1001 of FIG. 10 enables to implement logic calculation operations having as operands binary data stored in the cells connected to local read bit lines LRBLT<j> and LRBLF<j>.

To achieve this, general read bit lines GRBLT<j> and GRBLF<j> are first precharged to a high level via precharge circuit 1003 (by simultaneously setting to the on state and then to the off state transistors 1201 and 1203 of circuit 1003, by application of an appropriate control signal to node PCHB).

As an illustration, it is considered that two elementary cells 10 of a same column of rank j are simultaneously activated in read mode, the first one via its port RPT (FIG. 2) only, and the second one via its port RPF (FIG. 2) only. To achieve this, after having precharged to a high level the read bit lines LRBLT<j> and LRBLF<j> of the column and set to a low level the reference conductive tracks VGNDT and VGNDF of the column, the selection transistor T4 (FIG. 2) of the first cell and the selection transistor T6 (FIG. 2) of the second cell are simultaneously turned on. The selection transistor T6 of the first cell and the selection transistor T4 of the second cell are maintained off (non-conductive).

The binary values stored on nodes BLTI (FIG. 2) of the two considered cells are respectively called A and B. Complementary binary values $\overline{A}$ and $\overline{B}$ are then stored on the respective nodes BLFI (FIG. 2) of the two cells. The output conductive track LRBLT<j> of the column remains at its high precharge level only if value A is at a low level, and the output conductive track LRBLF<j> of the column remains at its high precharge level only if value B is at a high level. Thus, the signal applied to the gate of transistor 1106 corresponds to the value complementary to value A, that is, it is at a low level if value A is at a high level, and at a low level if value A is at a high level. The signal applied to the gate of transistor 1102 corresponds to value A, that is, it is at a high level if value A is at a high level and at a low level if value A is at a low level. The signals applied to the gate of transistor 1104 and to the gate of transistor 1108 respectively correspond to value B and to the value complementary to value B.

Additional coupling circuit 1001 may be controlled to take a first configuration where switches S1 and S2 are on (conductive) and switches S3 and S4 are off (non-conductive) or to take a second configuration where switches S1 and S2 are off (non-conductive) and switches S3 and S4 are on (conductive).

In the first configuration (switches S1 and S2 on and switches S3 and S4 off), general read bit line GRBLT<j> discharges only if values A and B are both in the high state and general read bit line GRBLF<j> discharges only if signals A and B are both in the low state. In other words, the binary signal read from general read bit line GRBLT<j> corresponds to the result of a logic NAND operation between values A and B ($\overline{AB}$) and the binary signal read from general read bit line GRBLF<j> corresponds to the result of a logic NAND operation between values $\overline{A}$ and $\overline{B}$, that is, to the result of a logic OR operation between values A and B (A+B).

An advantage of such a configuration is that logic operations $\overline{A \cdot B}$ and A+B are performed locally, only the result of each operation being transmitted onto general read bit line GRBLT<j>, respectively GRBLF<j>. This provides a gain in power consumption associated with two primitive calculations in parallel. Indeed, by observing the truth tables disclosed hereafter of operations $\overline{A \cdot B}$ and A+B, it can be seen that by only reporting the result of logic operations $\overline{A \cdot B}$ and A+B onto the general read bit lines, there statistically is one chance out of four of discharging each general read bit line.

| A | B | $\overline{A \cdot B}$ | A + B |
|---|---|---|---|
| 0 | 0 | 1 | 0 |
| 0 | 1 | 1 | 1 |
| 1 | 0 | 1 | 1 |
| 1 | 1 | 0 | 1 |

If, conversely, the general read bit lines were used to directly read values A and B, there would statistically be one chance out of two of discharging each general read bit line.

Now, due to the relatively high capacity of the general read bit lines, the operations of recharge of the general read bit lines are consume a relatively high power as compared with operations of recharge of local read bit lines. Additional coupling circuit 1001 thus provides a gain in dynamic power consumption.

It should be noted that logic operations $\overline{A \cdot B}$ and A+B are particularly useful since they are elementary operations necessary to implement arithmetic addition operations.

In the second configuration of coupling circuit 1001 (switches S3 and S4 on and switches S1 and S2 off), the operation is similar, with the difference that the logic operations carried out are operations $\overline{A}$+B (the result of the operation being available on general read bit line GRBLT<j>) and A+$\overline{B}$ (the result of the operation being available on general read bit line GRBLF<j>). These two operations are also particularly useful since they are elementary operations necessary to implement arithmetic subtraction operations. Here again, the use of additional coupling circuit 1001 for the implementation of these operations provides a gain in dynamic power consumption associated with two primitive calculations in parallel.

Figure 11:
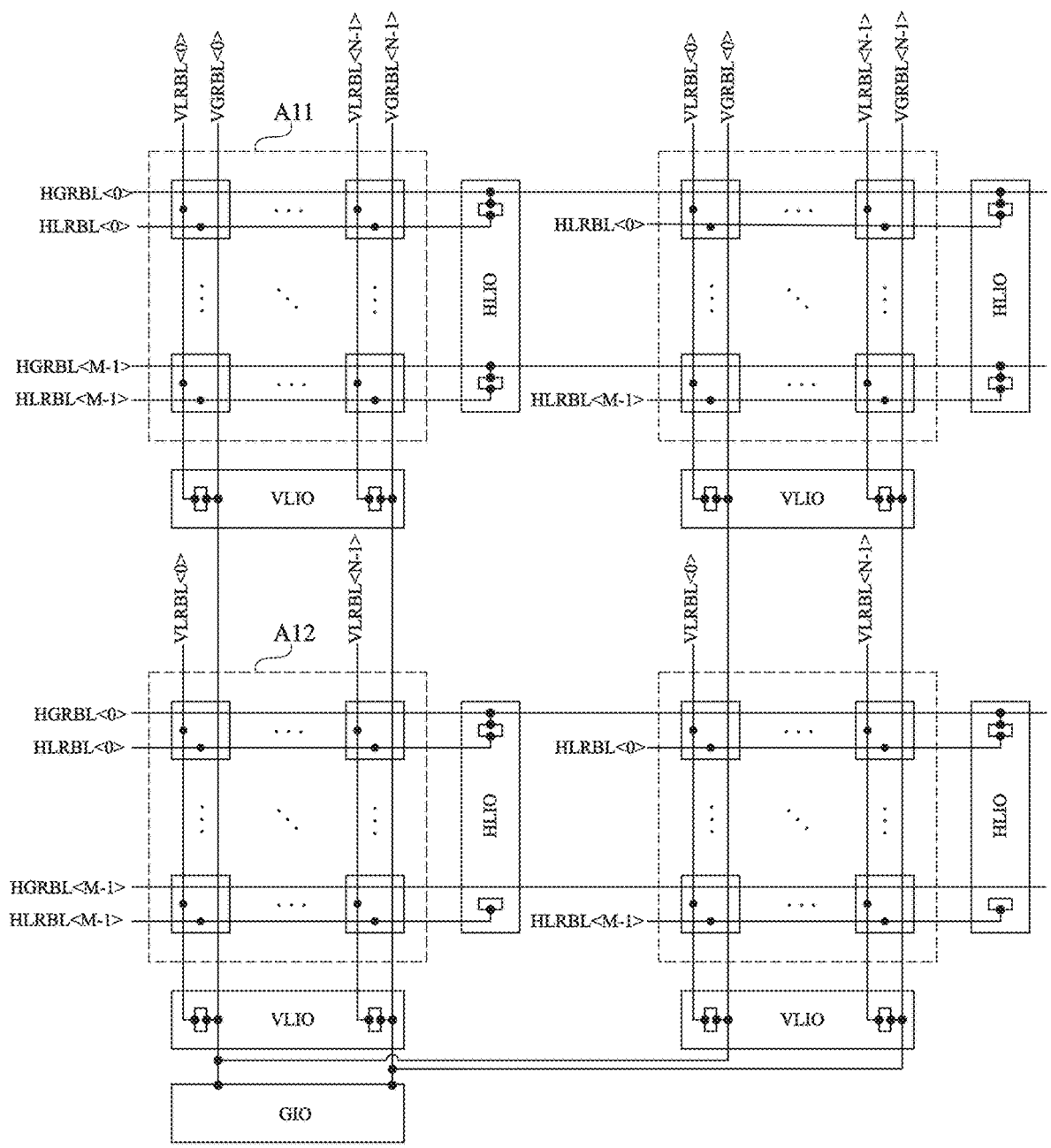
FIG. 11 illustrates another variation of a memory module according to an embodiment.

FIG. 11 illustrates another variation of a memory module according to an embodiment.

The memory module of FIG. 11 comprises the same elements as the memory module of FIG. 3, arranged substantially in the same way. However, in FIG. 11, arrays A1 and A2 of FIG. 3 are respectively designated with references A11 and A12. Further, the local read bit lines LRBL<j> of FIG. 3, also called vertical local read bit lines, are designated with reference VLRBL<j>, and the general read bit lines GRBL<j> of FIG. 3, also called vertical general read bit lines, are designated with reference VGRBL<j>. Further, the local input/output circuits LIO of FIG. 3, also called vertical local input/output circuits, are respectively designated with reference VLIO. In FIG. 11, for simplification, the row selection and control circuits RS and CTRL of the memory module have not been shown.

The memory module of FIG. 11 further comprises two additional arrays of elementary cells 10 A21 and A22, having the same dimensions as arrays A11 and A12, arrays A11, A12, A21, and A22 being arranged in an array of two rows and two columns. More particularly, in this example, arrays A11 and A21 form a first row of the array of arrays, and arrays A12 and A22 form a second row of the array of arrays.

As in arrays A11 and A12, in each of arrays A21 and A22 of the memory module, the elementary cells 10 of a same column of the array are directly connected (with no intermediate coupling circuit) to a same vertical local read bit line VLRBL<j> of the array.

Further, as for arrays A11 and A12, for each of arrays A21 and A22, the memory module comprises a vertical local input/output circuit VLIO specific to the array, for example, arranged at one end of the columns of the array, having the vertical local read bit lines VLRBL<j> of the array connected thereto. The vertical local read bit lines VLRBL<j> of the different arrays are however not directly interconnected.

For each column rank j of arrays A21 and A22, the memory module further comprises a vertical general read bit line VGRBL<j> common to the cells of the columns of rank j of arrays A21 and A22, having the local read bit lines VLRBL<j> of arrays A21 and A22 coupled thereto. In the same way as local read bit lines VLRBL<j>, general read bit lines VGRBL<j> extend in the column direction of arrays A21 and A22, that is, vertically in the orientation of FIG. 11.

As for arrays A11 and A12, for each of arrays A21 and A22 of the module, the vertical local input/output circuit VLIO associated with the array comprises, for each column of the array, a coupling circuit 31 coupling the local read bit line VLRBL<j> of the column to the general read bit line VGRBL<j> of the same column.

Vertical general read bit lines VGRBL<j> are connected to a same general input/output circuit GIO of the module, common to arrays A11, A12, A21, and A22 of the module. In the shown example, general input/output circuit GIO has dimension N (N being the number of elementary cells per row in each of arrays A11, A12, A21, and A22 of the unit). In other words, in the present example, the vertical general read bit lines VGRBL<j> of same rank j of the module are coupled together, for example, interconnected, at the level of the general input/output circuit GIO of the module.

In each of arrays A11, A12, A21, and A22 of the memory module of FIG. 11, the elementary cells 10 of a same row of the array are further directly connected (with no intermediate connection circuit) to a same output conductive track or horizontal local read bit line HLRBL of the array, it being understood that the elementary cells 10 of different rows are connected to different horizontal local read bit lines HLRBL. In other words, for each row of rank i of the array, where i is an integer in the range from 0 to M−1, M designating the number of rows of the array, the array comprises a horizontal local read bit line HLRBL<i> specific to the row, interconnecting the row cells.

As compared with the example of FIG. 2, each elementary cell 10 may comprise one or a plurality of additional transistors coupling the storage node BLTI of the cell to the horizontal local read bit line HLRBL<i> of the row containing the cell. As an example, each elementary cell 10 may comprise an additional access port RPT' identical or similar to port RPT, coupling the storage node BLTI of the cell to the horizontal local read bit line HLRBL<i> of the row containing the cell.

For each of arrays A11, A12, A21, and A22, the memory module comprises a horizontal local input/output circuit HLIO specific to the array, for example, arranged at one end of the rows of the array, having the horizontal local read bit lines HLRBL<i> of the array connected thereto. The horizontal local read bit lines HLRBL<i> of the different arrays are however not directly interconnected.

For each row index i of arrays A11 and A21, the module further comprises a conductive track HGRBL<i> common to the cells of rank i of arrays A11 and A21, called horizontal general read bit line, having the horizontal local read bit lines HLRBL<i> of arrays A11 and A21 coupled thereto. In the same way as horizontal local read bit lines HLRBL<i>, horizontal general read bit lines HGRBL<i> extend in the row direction of arrays A11 and A21, that is, horizontally in the orientation of FIG. 11. Similarly, for each row index i of arrays A12 and A22, the module comprises a horizontal general read bit line HGRBL<i> having the horizontal local read bit lines HLRBL<i> of arrays A12 and A22 coupled thereto.

For each of arrays A11, A12, A21, and A22 of the module, the horizontal local input/output circuit HLIO associated with the array comprises, for each row of the array, a coupling circuit 31 coupling the local read bit line HLRBL<i> of the row to the general read bit line HGRBL<i> of this same row. Coupling circuit 31, for example identical or similar to circuit 31 of FIG. 4, is controllable to transfer a binary signal from local read bit line HLRBL<i> to general read bit line HGRBL<i>, or to transfer a binary signal from general read bit line HGRBL<i> to local read bit line HLRBL<i>, or to isolate local read bit line HLRBL<i> from general read bit line HGRBL<i>.

Horizontal general read bit lines HGRBL<i> may be connected to a same horizontal general input/output circuit of the module (not shown in FIG. 11), common to arrays A11, A12, A21, and A22 of the module. As an example, the horizontal general input/output circuit has dimension M (M being the number of elementary cells per column in each of arrays A11, A12, A21, and A22 of the unit). In this case, the horizontal general bit lines HGRBL<i> of same rank i of the module are coupled together, for example, interconnected, at the level of the horizontal general input/output circuit of the module.

An appropriate control of coupling circuits 31 enables to implement calculation operations having has operands data stored in different arrays of the module, whatever the positions of said arrays in the module.

An advantage of the arrangement described in relation with FIG. 11 is that it enables to have data transit from a vertical local or general bit line to a horizontal local or general bit line.

To enable to rewrite the result of a calculation or read operation performed via the horizontal read bit lines of the module without having the calculated or read data transit through circuits external to the memory module, and particularly over a data bus external to the module, each horizontal local input/output circuit HLIO of the memory module may comprise an internal redirection circuit (not shown) enabling to couple the local read bit line(s) of each row of the corresponding array to a data write bit line of the row and/or of another row of the array, or also to a data write bit line of a column of the array.

Of course, the number of arrays of the module and the layout of the arrays in the module may be different from what has been shown and described in relation with FIG. 11.

Further, similarly to what has been described in relation with FIG. 11, the embodiments of FIGS. 5, 6, 8, and 9 may be adapted to provide, in each array, horizontal local read bit lines directly connected to the elementary cells of the array, and horizontal general read bit lines coupled to the horizontal local read bit lines by coupling circuits 31.

Specific embodiments have been described. Various alterations and modifications will occur to those skilled in the art. In particular, the described embodiments are not limited to the embodiment of elementary cells 10 described in relation with FIG. 2, nor to the embodiments of coupling circuits described in relation with FIGS. 4 and 7. More generally, it will be within the abilities of those skilled in the art to implement the desired operation with other architectures of elementary cells and/or of internal coupling circuits (circuits 31) or external coupling circuits (circuits 61) of the memory modules.

It should further be noted that the embodiments described in relation with FIGS. 5, 6, 7, 8, and 9 and the embodiment described in relation with FIGS. 3 and 4 may be combined, that is, modules partitioned into a plurality of arrays (such as described in relation with FIGS. 3 and 4) may be coupled by external coupling circuits 61 within a same memory circuit (such as described in relation with FIGS. 5, 6, 7, 8, and 9).

Further, embodiments where general read bit lines and coupling circuits are used to couple together local read bit lines of a plurality of arrays of elementary cells of a same memory module or of a same memory circuit, to carry out calculation operations having as operands data stored in different arrays of the module or of the circuit, have been described hereabove.

More generally, the provided architecture may be used to transfer data from one array to another for other applications than the implementation of a calculation operation.

As an example, in a first array, the general bit lines of the array may be coupled to the local read bit lines of the array as described hereabove, while in a second array, the general bit lines may be coupled to write bit lines of the array to allow a direct transfer of data read from the first array for their writing into the second array.

As a variation, the memory module or circuit may comprise arrays of elementary cells of different natures, for example a first array of SRAM cells of the type described in relation with FIG. 2 and a second array of CAM ("Content Addressable Memory") cells. In this case, the general bit lines of the first array may be coupled to the local read bit lines of the array as described hereabove while the general bit lines of the second array may be coupled to content search bit lines of the second array, to allow a direct transfer of the data read from the first array to perform content searches in the second array.

Further, the described embodiments are not limited to the above-described examples where the elementary cells of the memory circuit are SRAM-type cells. More generally, the described embodiment may apply to other cell technologies, for example, ReRAM-type cells (non-volatile resistive memory) or DRAM-type cells (capacitive dynamic memory).

As an example, to form a ReRAM-type memory circuit, it may be provided, in cell 12 of FIG. 2, to replace the antiparallel association of two inverters with a series association of two resistive elements having a programmable resistance, a first end of said series association being coupled to a node of application of a high power supply potential of the cell, the second end of said series association being coupled to a node of application of a low power supply potential of the cell, and the intermediate node of said series association, or junction point of the two resistive elements, forming storage node BLTI of the cell.

As a variation, to form a DRAM-type memory circuit, it may be provided, in cell 12 of FIG. 2, to replace the antiparallel association of two inverters by a capacitive element having a first electrode coupled, for example, connected, to node BLTI, and a second electrode coupled, for example, connected, to a node of application of a reference potential of the cell.

The invention claimed is:

1. A memory circuit comprising a plurality of elementary cells distributed in a plurality of arrays, each comprising M rows and N columns, M and N being integers greater than or equal to 2, wherein:
    each column of each array comprises a first local bit line directly connected to each of the cells in the column;
    each column of each array comprises a first general bit line coupled to the first local bit line of the column by a first coupling circuit, the first coupling circuit being controllable to:
        isolate the first local bit line of the column from its first general bit line,
        transmit over the first general bit line of the column a binary signal present on its first local bit line, or
        transmit over the first local bit line of the column a binary signal present on its first general bit line; and
    the first general bit lines of the columns of same rank j of the different arrays, j being an integer in the range from 0 to N−1, are coupled together,
    and wherein, in each column of each array, the first local bit line and the first general bit line of the column extend along the column direction, and wherein, for each column of each array, the memory circuit further comprises a first additional general bit line connected to the first general bit line in the column, the first additional general bit line extending orthogonally to the column direction.

2. The memory circuit of claim 1, wherein each first coupling circuit comprises:
    first and second transistors series-connected between a node of application of a power supply voltage of the circuit and the first general bit line of the column; and
    third and fourth transistors series-connected between the first local bit line of the column and a node of application of a reference potential of the circuit,
    the gate of the second transistor being connected to the first local bit line of the column and the gate of the third transistor being connected to the first general bit line of the column.

3. The memory circuit of claim 1, wherein said arrays belong to a same memory module, the first general bit lines of the columns of same rank j of the different arrays being directly interconnected.

4. The memory circuit of claim 1, wherein said arrays belong to different memory modules, the first general bit lines of the columns of same rank j of the different arrays being coupled in series via additional coupling circuits.

5. The memory circuit of claim 4, wherein each additional coupling circuit coupling in series a first general bit line of a first column of rank j of a memory module to a first general bit line of a second column of same rank j of a neighboring memory module is controllable to:
    isolate said first general bit lines from each other,
    copy onto the first general bit line of the second column a binary signal present on the first general bit line of the first column, or
    copy onto the first general bit line of the first column a binary signal present on the first general bit line of the second column.

6. The memory circuit of claim 5, wherein each additional coupling circuit comprises:
    an amplifier having an input coupled to the first general bit line of the first column by a fifth transistor and an output coupled to the first general bit lines of the second column by a sixth transistor;
    a seventh transistor coupling the first general bit line of the first column to the output of the amplifier; and
    an eighth transistor coupling the first general bit line of the second column to the input of the amplifier.

7. The memory circuit of claim 6, wherein in each additional coupling circuit, the gates of the fifth and sixth transistors are connected to a same control conductive track of the coupling circuit and the gates of the seventh and eighth transistors are connected to a same second control conductive track of the coupling circuit.

8. The memory circuit of claim 1, wherein said plurality of arrays are arranged in an array of rows and columns, the arrays of a same column being coupled to one another by their first general bit lines and the arrays of a same row being coupled to one another by their first additional general bit lines.

9. The memory circuit of claim 1, comprising a control circuit capable of simultaneously activating in read mode a first cell of a column of rank j of a first array of the memory circuit, and a second cell of a second column of same rank j of a second array of the memory circuit, and of controlling the coupling circuit(s) coupling the first local bit line of the first column to the first local bit line of the second column to transmit over the first local bit line of the second column a binary signal present on the first local bit line of the first column, to perform a logic operation having as operands the data stored in the first and second cells.

10. The memory circuit of claim 1, wherein:
    each column of each array comprises a second local bit line directly connected to each of the cells in the column; and
    each column of each array comprises a second general bit line coupled to the second local bit line of the column by a second coupling circuit, the second coupling circuit being controllable to:
        isolate the first local bit line of the column from its second general bit line,
        transmit over the second general bit line of the column a binary signal present on its second local bit line, or
        transmit over the second local bit line of the column a binary signal present on its second general bit line; and
    the second general bit lines of the columns of same rank j of the different arrays are interconnected.

11. The memory circuit of claim 10, further comprising, for each column of each array, an additional circuit connected to the first and second local bit lines and to the first and second general bit lines of the column, the additional circuit being capable of implementing logic calculation operations having as operands binary data applied to the first and second local bit lines of the column and of supplying the results of these operations on the first and second general bit lines of the column.

12. The memory circuit of claim 11, wherein the additional circuit comprises:
a first transistor coupling the first general bit line to a first intermediate node;
a second transistor coupling a second intermediate node to a node of application of a low power supply potential of the memory circuit;
a third transistor coupling the second general bit line to a third intermediate node;
a fourth transistor coupling a fourth intermediate node to the node of application of the low power supply potential of the memory circuit;
a first switch coupling the first intermediate node to the second intermediate node;
a second switch coupling the third intermediate node to the fourth intermediate node;
a third switch coupling the second intermediate node to the third intermediate node; and
a fourth switch coupling the first intermediate node to the fourth intermediate node.

13. The memory circuit of claim 12, wherein:
the gate of the third transistor of the additional circuit is coupled to the first local bit line of the column;
the gate of the second transistor of the additional circuit is coupled to the second local bit line of the column;
the gate of the first transistor of the additional circuit is coupled to a node supplying a binary signal complementary to the binary signal carried by the first local read bit line of the column; and
the gate of the fourth transistor is coupled to a node supplying a binary signal complementary to the binary signal carried by the second local read bit line of the column.

14. The memory circuit of claim 1, wherein:
each row of each array comprises a first local bit line directly connected to each of the cells in the row;
each row of each array comprises a first general bit line coupled to the first local bit line of the row by a first coupling circuit, the first coupling circuit being controllable to:
isolate the first local bit line of the row from its first general bit line,
transmit over the first general bit line of the row a binary signal present on its first local bit line, or
transmit over the first local bit line of the row a binary signal present on its first general bit line; and
the first general bit lines of the rows of same rank i of the different arrays, i being an integer in the range from 0 to M−1, are coupled together.

* * * * *